United States Patent
Honda et al.

(10) Patent No.: US 7,528,651 B2
(45) Date of Patent: May 5, 2009

(54) NOISE FREE IMPLEMENTATION OF PWM MODULATOR COMBINED WITH GATE DRIVER STAGE IN A SINGLE DIE

(75) Inventors: Jun Honda, El Segundo, CA (US); Xiao-chang Cheng, San Jose, CA (US)

(73) Assignee: International Rectifier Corporation, El Segundo, CA (US)

( * ) Notice: Subject to any disclaimer, the term of this patent is extended or adjusted under 35 U.S.C. 154(b) by 77 days.

(21) Appl. No.: 11/744,960

(22) Filed: May 7, 2007

(65) Prior Publication Data

US 2007/0258180 A1    Nov. 8, 2007

Related U.S. Application Data

(60) Provisional application No. 60/798,499, filed on May 8, 2006, provisional application No. 60/864,256, filed on Nov. 3, 2006.

(51) Int. Cl.
*H03F 3/38* (2006.01)

(52) U.S. Cl. ......................................... 330/10; 330/262

(58) Field of Classification Search .................. 330/10, 330/251, 207 A, 262, 307
See application file for complete search history.

(56) References Cited

U.S. PATENT DOCUMENTS

| | | | | |
|---|---|---|---|---|
| 6,859,074 | B2 * | 2/2005 | Ajit | 327/108 |
| 7,002,379 | B2 * | 2/2006 | Ajit | 327/108 |
| 2002/0158299 | A1 * | 10/2002 | Castro Simas et al. | 257/499 |
| 2005/0030402 | A1 | 2/2005 | Agranov et al. | |
| 2005/0083116 | A1 | 4/2005 | Risbo et al. | |
| 2005/0151585 | A1 | 7/2005 | Honda et al. | |

* cited by examiner

*Primary Examiner*—Henry K Choe
(74) *Attorney, Agent, or Firm*—Ostrolenk, Faber, Gerb & Soffen, LLP

(57) ABSTRACT

An integrated noise isolation circuit on a single silicon substrate die having a structural arrangement that minimizes noise. The integrated circuit including a noise sensitive circuit including an input stage; a noise generating circuit including an output stage; at least one high voltage level shift circuit coupling the noise generating and noise sensitive circuits for transferring a signal from the input to the output stage; and at least one floating structure for isolating influence of the noise.

18 Claims, 3 Drawing Sheets

NOISE FREE IMPLEMENTATION OF PWM MODULATOR COMBINED WITH GATE DRIVER STAGE IN A SINGLE DIE

CROSS-REFERENCE TO RELATED APPLICATIONS

This application is based on and claims priority to U.S. Provisional Patent Application Ser. Nos. 60/798,499, filed on May 8, 2006 and entitled NOISE FREE IMPLEMENTATION OF PWM MODULATOR COMBINING WITH GATE DRIVER STAGE IN A SINGLE DIE and 60/864,256, filed Nov. 3, 2006 and entitled NOISE FREE IMPLEMENTATION OF PWM MODULATOR COMBINING WITH GATE DRIVER STAGE IN A SINGLE DIE, the entire contents of which are hereby incorporated by reference herein.

BACKGROUND OF THE INVENTION

The present invention relates to integration of noise sensitive and noise generating circuits on a single die in a structural arrangement that minimizes noise coupling from the noise generating circuit to noise sensitive circuit.

A system-on-a-chip solution requires implementation of different function blocks are into a single silicon die. This creates potential problems of noise coupling between the noise generating and noise sensitive circuits. When a gate driver IC integrates more noise sensitive function blocks, it is important to avoid noise coupling a noise generating gate driver stage and other noise sensitive function blocks, e.g., analog circuits or PWM modulator.

Two kinds of noise couplings are present inside the gate driver IC, they are voltage induced capacitive coupling, and current and common stray impedance induced voltage coupling. The noise in the voltage induced capacitive coupling is caused by dV/dt transition of a floating well. Since the floating well having high-side driver has to be biased on a switching node, which has a large voltage transition, the dV/dt transition injects a current through a stray capacitance to the noise sensitive circuits.

This stray capacitance between the floating well and a substrate is inevitable. Therefore, combining the noise current injection with a stray inductance in power supply lines, the low-side voltage potential becomes noisy. As long as the noise sensitive blocks sit on the substrate, it is difficult to remove influences from a dV/dt induced noise injection.

The current induced noise coupling is caused by di/dt transition of a gate drive output stage. If the other functional blocks are sharing the same power supply, the noise voltage, created by the di/dt and stray inductance modulates the supply voltage, causes poor performance in noise sensitive circuits. The only way to avoid this noise injection is to separate power supply lines from each other. This, however, requires more pin outs. Even so, there will be a capacitive coupling remaining.

SUMMARY OF THE INVENTION

It is an object of the present invention to provide a junction isolation to terminate noise coupling.

An integrated noise isolation circuit is provided on a single silicon substrate die having a structural arrangement that minimizes noise. The integrated circuit including a noise sensitive circuit including an input stage; a noise generating circuit including an output stage; at least one high voltage level shift circuit coupling the noise generating and noise sensitive circuits for transferring a signal from the input to the output stage; and at least one floating structure for isolating influence of the noise.

Other features and advantages of the present invention will become apparent from the following description of the invention that refers to the accompanying drawings.

DETAILED DESCRIPTION OF EMBODIMENTS OF THE INVENTION

Figure 1:
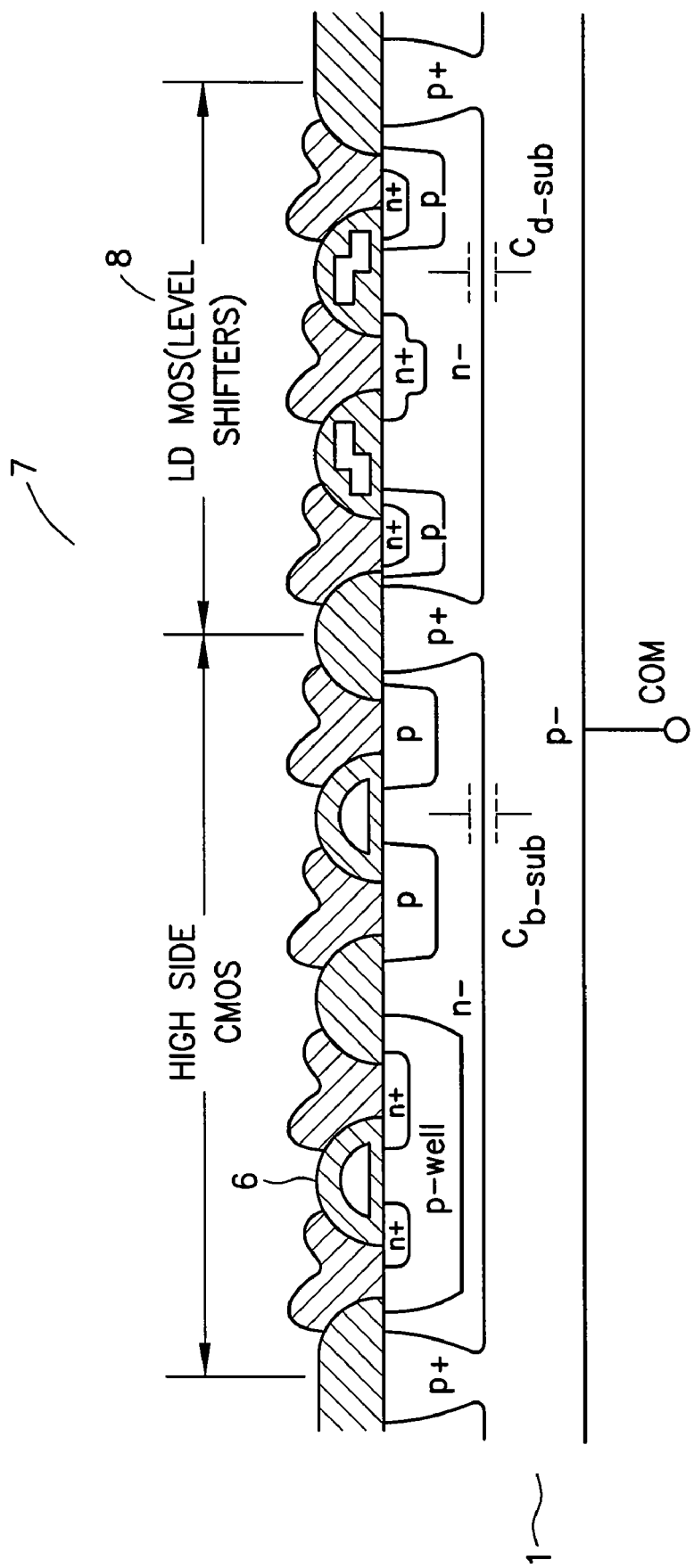
FIG. 1 is a diagram of PWM input stage floating structure on a silicon substrate.

As illustrated in FIG. 1, the present invention provides noise isolation by making PWM input stage a floating structure 6 to silicon substrate 1. This isolates the influence of the noise. The floating structure 6 is made by a reverse biased PN junction inside an IC 7 (COM pin connects to −VCC). Because a gate driver can directly input a PWM signal reference to the ground level, an external circuit is not necessary. A high voltage level shift circuit is placed over the PN junction that achieves the floating structure, so that the PWM signal is transferred to this floating structure.

Figure 2:
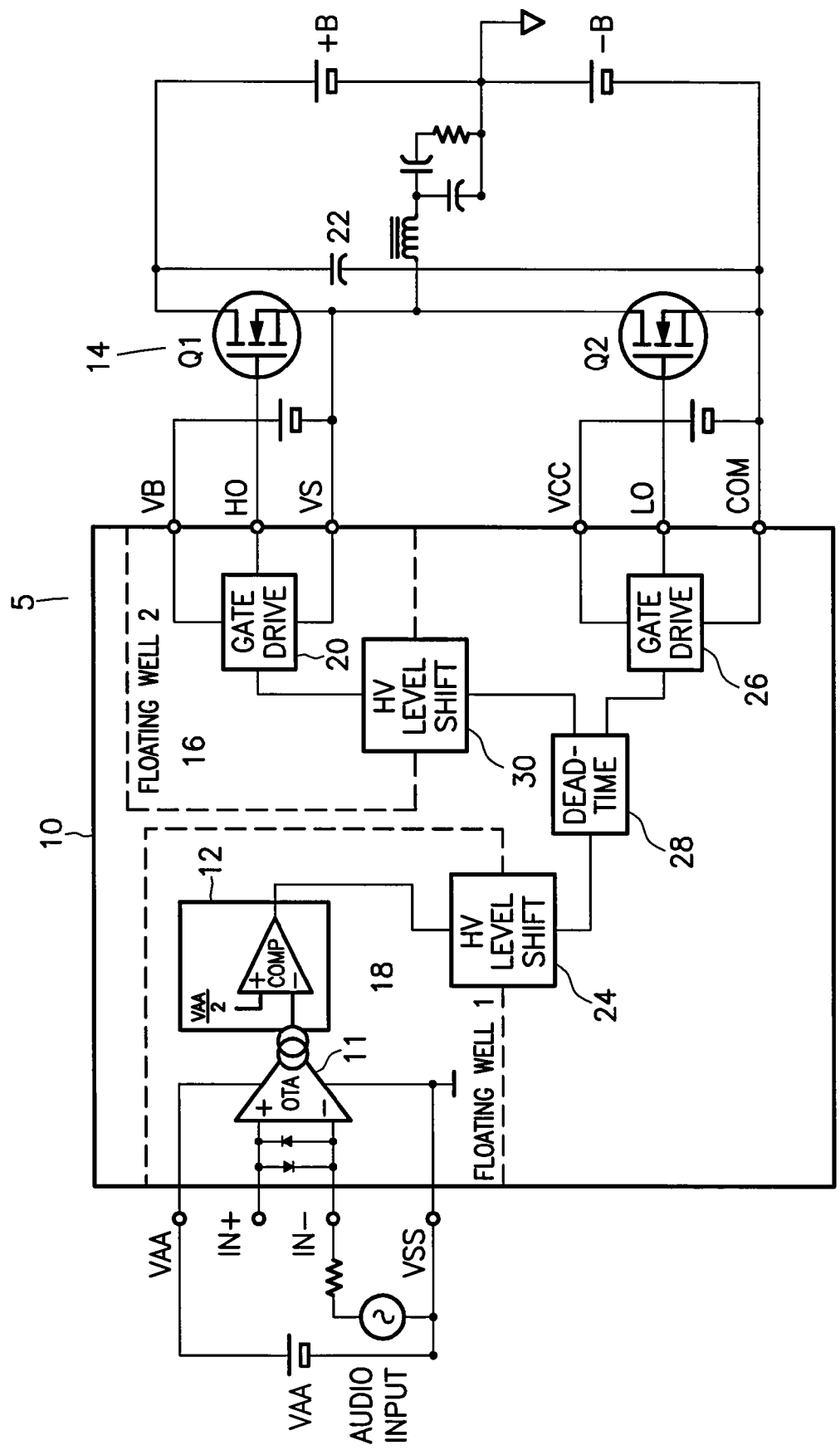
FIG. 2 is a circuit diagram of one embodiment of the present invention utilized in a Class D audio amplifier.

Two embodiments of the proposed junction isolation, used to terminate noise coupling, are presented below using Class D audio amplifier application as an example. In the first embodiment, illustrated in FIG. 2, a gate driver integrated circuit 10, of an amplifier 5, integrates a noise sensitive analog PWM modulator 12 on a substrate while a gate driver 20 including a floating high-side well 16 for driving a high-side MOSFET Q1. The PWM modulator 12 receives an input signal from an Operational Transconductance Amplifier 11, which receives an audio input. A noise current injects from the high-side well 16 to the substrate through a stray capacitance between the high-side well 16 and the substrate, causing poor performance in the analog PWM section 12.

This poor performance in the analog PWM section 12 is overcome by the dV/dt induced noise coupling. As shown, the noise sensitive circuit 12 sits on a floating well 18. The noise current, injected to the substrate due to the dV/dt of the floating high-side gate driver 20 is terminated by a node tied to a negative power supply. Therefore, there is no capacitive coupling between the two floating wells 16 and 18.

Thus, the noise current generated by a capacitor formed between the high-side floating well 12 and the substrate flows back to the power supply. The input floating well 18 is completely independent from the noise current generated by switching activities of the gate driver stage 20.

Further, since the input circuitry is isolated from other functional blocks of the gate driver 10 by a first high voltage level shifter 24 that carries PWM signals, a potential of the substrate can accept the noise from a stray impedance of a negative power supply rail VSS, enabling optimum routing for a low-side gate drive 26 driving a low-side MOSFET Q2.

The illustrated circuit also includes a dead-time detection circuit 28 that accepts the PWM signals from the first high voltage level shifter 24 and alternatively passes them to the second high voltage level shifter 30 for the high-side gate drive 20 and the low-side gate drive 26.

Figure 3:
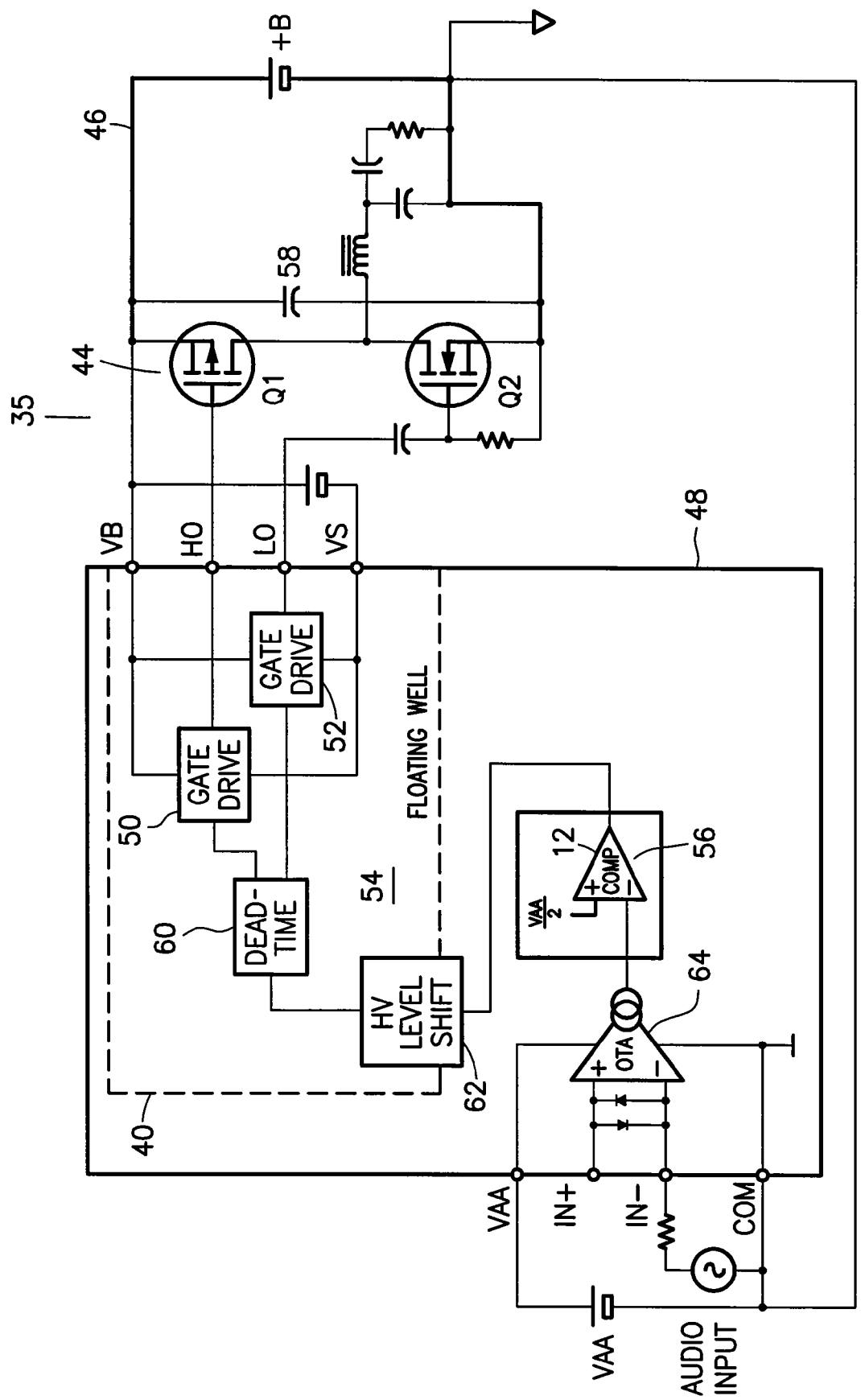
FIG. 3 is a circuit diagram of another embodiment of the present invention utilized in a Class D audio amplifier.

In a second embodiment, illustrated in FIG. 3, an amplifier 35 running with a single power supply, potentially has a noise} problem with common impedance in grounding as both an amplifier power stage 64 and a noise sensitive stage 56 have to share the same ground eventually. When it comes to the Class D amplifier topology, these constraint of the common ground becomes a more complex issue, because of gate drive requirements. In order for a gate driver integrated circuit 48 to ensure robustness and quality of switching, a lowest potential node, which is usually the substrate of the die driving low-side MOSFET Q2, has to go as close as possible to the low-side source. This means that reference for the noise sensitive circuits the substrate cannot be quiet to the central ground.

As illustrated, one way to avoid signal interference from the shared ground is to separate them. However, by doing this, a gate driver stage 40 and the noise sensitive circuit 56 sit on a different potential causing an issue of transmitting a signal between two different potentials. Additionally, providing separate ground routings requires space.

Alternatively, another way of getting rid of noise injection from a common ground impedance, is to have a different mode input in an error amplifier. However, achieving high common mode rejection at high frequency, where all the switching noise is at, is very difficult.

Thus, for overcoming di/dt induced noise coupling, both hi and low side gate driver stages 50 and 52 in a floating high-side well 54 which is biased to a fixed potential of positive power supply. Therefore, the error amplifier 56 sitting on the substrate directly is free from the gate driving current. There is no noise coupling through a stray capacitor between the high-side well 54 and the substrate because the high-side well 54 is biased to a fix potential, not a switching node.

The illustrated circuit 35 also includes a dead-time detection circuit 60 that accepts the PWM signals from a high voltage level shifter 62 and alternatively passes them to the high- and low-side gate drives 50 and 52. Also, as above, the PWM modulator 56 receives an input signal from an Operational Transconductance Amplifier 64, which receives an audio input.

The benefits provided by the present invention include the following:

Making multiple channel design easier by freeing the noise sensitive low-side circuitry from gate charging and discharging current paths. It is now possible to connect a noise sensitive substrate node of the amplifier 35 to a small ground signal without having any degradation in a gate drive path.

Since high voltage level shifter 24, 62 carries quantized PWM signal, noise immunity is quite substantial. Because of the PWM signal transfer in the high voltage level shifter 24, 62, the error amplifier 12, 56, is identical to and has very high common mode noise rejection ratio, potentially much better compared to, a conventional differential input error amplifier structure.

The acceptable amplitude of incoming common mode noise to the PWM modulator 12, 56 or error amplifier stage is much higher than the case using a differential amplifier. In the above discussed embodiment, acceptable noise amplitude at pin COM, having common voltage with respect to the reference ground, is same as the high voltage level shifter capability, which can be in a range from +B down to −200V, with high dV/dt.

Accuracy of dead-time insertion. Signal paths to the gate drive output for each channel are identical, therefore, the delay matching between the high and low side can be minimized as compared to the high voltage level shifter being present only on the high-side.

As the low-side MOSFET is driven through a capacitor from the high-side well, there should be an initial charging current at start-up, making the low-side turn ON for a short time. This is not going to cause a problem because when the amplifier 10, 48 is starting up there is no charge in the output DC blocking capacitor.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A noise isolation circuit on a single silicon substrate die having a structural arrangement that minimizes noise, the circuit comprising:
   a noise sensitive circuit including an input stage;
   a noise generating circuit including an output stage;
   at least one high voltage level shift circuit coupling the noise generating and noise sensitive circuits for transferring a signal from the input to the output stage; and
   at least one floating structure for isolating influence of the noise, wherein a portion of at least one of the input and output stages is formed in the at least one floating structure.

2. A noise isolation circuit on a single silicon substrate die having a structural arrangement that minimizes noise, the noise isolation circuit comprising:
   a noise sensitive circuit including an input stage;
   a noise generating circuit including an output stage;
   at least one high voltage level shift circuit coupling the noise generating and noise sensitive circuits for transferring a signal from the input to the output stage; and
   at least one floating structure for isolating influence of the noise, wherein the at least one floating structure is provided by reverse biasing a PN junction inside the silicon substrate.

3. The circuit of claim 2, wherein the at least one high voltage level shift circuit is placed over the PN junction.

4. The circuit of claim 1, wherein the circuit is adaptable to drive a half-bridge stage that includes high- and low-side switches connected at a common switching node.

5. The circuit of claim 4, wherein the output stage includes high- and low-side gate driver circuits, the low-side gate driver circuit being able to directly connect the signal to the ground level without requiring external circuits.

6. A noise isolation circuit on a single silicon substrate die having a structural arrangement that minimizes noise, the noise isolation circuit comprising:
   a noise sensitive circuit including an input stage;
   a noise generating circuit including an output stage, the output stage including high- and low-side gate driver circuits, the low-side gate driver circuit being able to directly connect a signal to the ground level without requiring external circuits;
   at least one high voltage level shift circuit coupling the noise generating and noise sensitive circuits for transferring the signal from the input to the output stage; and
   at least one floating structure for isolating influence of the noise, the at least one floating structure includes first and second floating structures, the input stage being formed inside the first floating structure, and the high-side gate driver circuit being formed inside the second floating structures,
   wherein the noise isolation circuit is a Class D audio amplifier having a half-bridge stage that includes high- and low-side switches connected at a common switching node.

7. The circuit of claim 6, further comprising a capacitor formed between the second floating structure and the silicone substrate for allowing the noise current generated by the capacitor to flow back to a power supply.

8. The circuit of claim 6, wherein there is no capacitive coupling between the first and second floating wells because the noise current injected to the substrate due to the dV/dt of the high-side gate driver is terminated by a node tied to a negative power supply.

9. The circuit of claim 6, wherein the input stage comprises:
   a noise sensitive analog PWM modulator; and
   an Operational Transconductance Amplifier for receiving an audio input and providing an input signal to the noise sensitive analog PWM modulator.

10. The circuit of claim 6, wherein the high-side gate driver circuit controls the high-side switch and the first floating structure is independent from a noise current generated by the high-side gate driver circuit.

11. The circuit of claim 6, wherein a dV/dt induced noise coupling of the first floating structure overcomes poor performance of the noise sensitive analog PWM modulator caused by noise current injections from the second floating structure to the silicon substrate through a stray capacitance between the second floating structure and the silicon substrate.

12. The circuit of claim 6, wherein the at least one high voltage level shift circuit comprises first and second high voltage level shift circuits, the first high voltage level shift circuit isolates the input stage from the high- and low-side gate driver circuits, a potential of the silicon substrate accepting the noise from stray impedance of a negative power supply rail VSS, enabling optimum routing for the low-side gate drive circuit driving the low-side switch.

13. The circuit of claim 4, wherein the output stage includes high- and low-side gate driver circuits, the high- and low-side gate driver circuits being formed inside the at least one floating structure for overcoming di/dt induced noise coupling, the at least one floating structure being biased to a fixed potential of a positive power supply.

14. The circuit of claim 13, wherein the input stage comprises:
   a noise sensitive analog PWM modulator; and
   an Operational Transconductance Amplifier for receiving an audio input and providing an input signal to the noise sensitive analog PWM modulator.

15. The circuit of claim 13, wherein the noise sensitive analog PWM modulator is free from a gate driving current.

16. The circuit of claim 13, wherein no noise coupling exists through a stray capacitor between the at least one floating structure and the silicon substrate because the at least one floating structure is biased to a fixed potential instead of the common switching node.

17. The circuit of claim 4, wherein the noise isolation circuit and the half-bridge stage form a Class D audio amplifier.

18. The circuit of claim 5, wherein the at least one floating structure includes first and second floating structures, the input stage being formed inside the first floating structure, and the high-side gate driver circuit being formed inside the second floating structure.

* * * * *